United States Patent
Boden, Jr.

(10) Patent No.: US 6,894,345 B2
(45) Date of Patent: May 17, 2005

(54) P CHANNEL RAD HARD MOSFET WITH ENHANCEMENT IMPLANT

(75) Inventor: Milton J. Boden, Jr., Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 329 days.

(21) Appl. No.: 10/205,125

(22) Filed: Jul. 23, 2002

(65) Prior Publication Data

US 2004/0016945 A1 Jan. 29, 2004

(51) Int. Cl.$^7$ .......................... H01L 29/76; H01L 29/94
(52) U.S. Cl. ...................... 257/327; 257/337
(58) Field of Search ................. 257/327, 328, 257/335, 341, 342, 137, 268, 337; 438/953

(56) References Cited

U.S. PATENT DOCUMENTS

| 5,338,693 A | * | 8/1994 | Kinzer et al. ............ 438/268 |
| 5,831,318 A | * | 11/1998 | Spring et al. ............ 257/402 |
| 6,541,820 B1 | * | 4/2003 | Bol ............................ 257/341 |
| 6,747,312 B2 | * | 6/2004 | Boden, Jr. ................ 257/327 |
| 6,798,016 B2 | * | 9/2004 | Boden, Jr. ................ 257/327 |
| 2004/0183127 A1 | * | 9/2004 | Boden, Jr. ................ 257/327 |

* cited by examiner

Primary Examiner—Chandra Chaudhari
Assistant Examiner—William C. Vesperman
(74) Attorney, Agent, or Firm—Ostrolenk, Faber, Gerb & Soffen, LLP

(57) ABSTRACT

A P channel vertical conduction Rad Hard MOSFET has a plurality of closely spaced base strips which have respective sources to form invertible surface channels with the opposite sides of each of the stripes. A non-DMOS late gate oxide and overlying conductive polysilicon gate are formed after the source and base regions have been diffused. The base stripes are spaced by about 0.6 microns, and the polysilicon gate stripes are about 3.2 microns wide. A P type enhancement region is implanted through spaced narrow windows early in the process and are located in the JFET common conduction region which is later formed by and between the spaced base stripes. The device is a high voltage (greater than 25 volts) P channel device with very low gate capacitance and very low on resistance.

22 Claims, 3 Drawing Sheets

P CHANNEL RAD HARD MOSFET WITH ENHANCEMENT IMPLANT

RELATED APPLICATION

This application is related to application Ser. No. 10/138,164, filed May 1, 2002 entitled RAD HARD MOSFET WITH GRADED BODY DIODE JUNCTION AND REDUCED ON RESISTANCE (IR-1871); the disclosure of which is incorporated herein by reference.

FIELD OF THE INVENTION

This invention relates to MOSFET devices and processes for their manufacture and more specifically relates to a MOSFET for operation in a high radiation environment.

BACKGROUND OF THE INVENTION

Power MOSFETs are well known and processes for the manufacture of MOSFETs which are operable in high radiation [megarad ionizing radiation] environments are also known. Thus, it is known that a "late gate", which is a non-self aligned gate relative to an invertible channel region, should be used in the manufacture of such devices, known as Rad Hard (radiation hardened) devices. By using a late gate process, the gate oxide is not subjected to the high diffusion temperatures used for the diffusion of base and source regions. The exposure of the gate oxide to such high temperatures reduces the ability of the device to operate in a high radiation environment such as that experienced at very high altitudes or by orbiting space vehicles. Such processes are described in U.S. Pat. Nos. 5,338,693 in the name of Kyle Spring et al.; 5,475,252 in the name of Kyle Spring et al.; 5,831,318 in the name of Perry Merrill; and U.S. application Ser. No. 09/263,916 filed Mar. 5, 1999 in the name of Milton Boden et al. Those references describe the radiation problem and propose respective solutions.

In many applications of Rad Hard devices, a P channel MOSFET is desired. U.S. Pat. No. 6,165,821 describes a P channel Rad Hard device which is not only resistant to high ionizing radiation, but is also resistant to SEE (single or plural high energy particle) problems.

The topology employed for Rad Hard devices may be cellular, but in some cases, such as for MOSFETs with a low gate capacitance it is also known that a stripe geometry is preferred, as described in U.S. Ser. No. 09/263,916.

Many MOSFET applications have the required condition of high voltage (in excess of about 50 volts), and low $R_{DSON}$. It is known that the $R_{DSON}$ of a cellular MOSFET can be reduced by an increasing (often termed enhancing) the conductivity in the JFET region between spaced bases. This reduces the resistance of the inherent JFET region and reduces the pinch-off of the region by reducing the expansion of the depletion regions from the spaced bases forming the JFET. This type of enhanced concentration region and the process for its formation are described in U.S. Pat. Nos. 4,376,286; 4,593,302 and 4,680,853, both in the names of Lidow and Herman. These patents do not disclose or suggest how such an enhancement can be applied to a Rad Hard type device.

BRIEF SUMMARY OF THE INVENTION

The present invention is for a novel structure and process for its manufacture of a high voltage P channel Rad Hard MOSFET which has a reduced $Q_g$ and $R_{DSON}$. To obtain these conflicting requirements, a linear stripe geometry is used with a fine polysilicon gate line width of about $3.2\mu$ and a close spacing of about $3.6\mu$. The use of this close spacing permits the increase of the number of stripes (or cells) per unit area and thus increases the total channel width to reduce $R_{DSON}$. The JFET pinch is then reduced by a novel masked enhancement implant through a very narrow window (in contrast to the blanket implant of U.S. Pat. No. 4,593,302. This heavily doped enhancement region creates a heavily doped cylindrically shaped region in the parasitic JFET. Thus, $R_{DSON}$ is further considerably reduced.

DETAILED DESCRIPTION OF THE DRAWINGS

Figure 1:
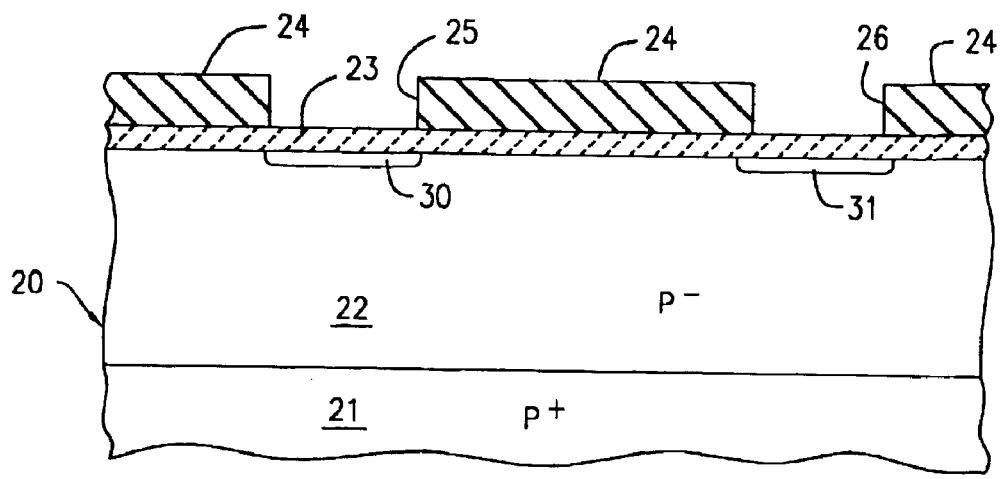
FIG. 1 is a cross-section of a small portion of the active area of a Rad Hard device wafer after the formation of an enhancement implant.

Referring first to FIG. 1, there is shown a very small portion of a monocrystaline silicon wafer 20 comprising a $P^+$ substrate 21 and an epitaxially deposited $P^-$ layer 22 on its top. The concentration and thickness of $P^-$ layer 22, which is the junction receiving layer, depend on the desired break down voltage of the final device, which may, for example, be 100 volts. The wafer is then processed to form a plurality of laterally spaced identical devices each consisting of a large number of stripes which are separated from one another, as by sawing. FIG. 1 shows several typical adjacent stripes of the active region of one such die. A conventional termination (not shown) is also used.

The top surface of region 22 is suitably cleaned and an enhancement screening oxide 23 about 500 Å thick is grown atop layer 22. An enhancement photoresist mask 24 is then applied atop oxide 23 and is photo-lithographically processed to form elongated stripe windows 25, 26 which are about 0.6 microns wide and are spaced, center-to-center, by about 6.8 microns. A boron enhancement implant at about 50 KeV and a dose of about 8E12 is then applied to the top surface, forming boron implants 30 and 31.

Figure 2:
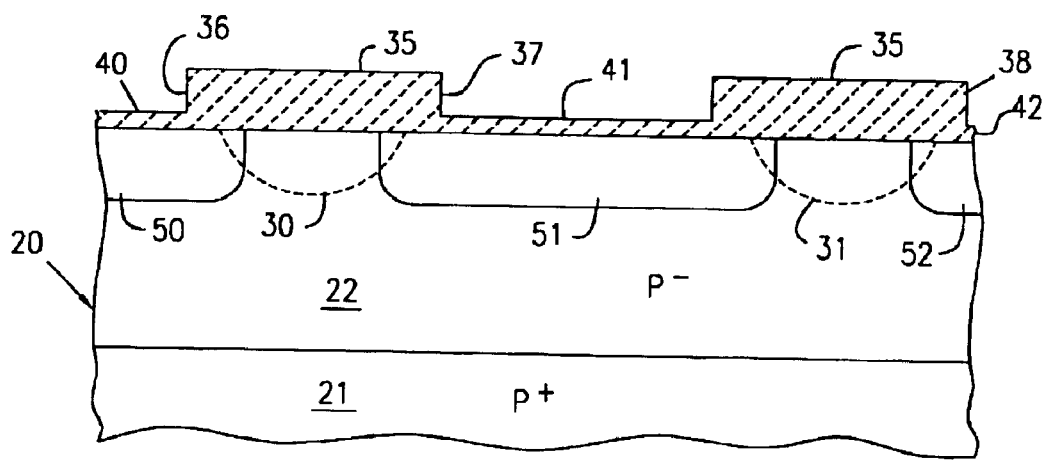
FIG. 2 is a cross-section of the wafer of FIG. 1 after the formation of spaced channel diffusion stripes and the drive of the enhancement implant.

The photoresist 24 is then stripped and, as shown in FIG. 2, the boron implants 30 and 31 are diffused at about 1050° C. for 120 minutes in an enhancement drive to a depth of about 8000 Å.

During this drive, $SiO_2$ oxide layer 35 is grown on the exposed silicon surface. A photoresist is then applied to the top surface and is exposed by a second photomask step (a channel mask) and the oxide 35 is plasma etched to form elongated stripe windows 36, 37 and 38. The photoresist is then stripped and a screening oxide 40, 41, 42 is grown to a thickness of about 500 Å. A phosphorus channel implant at about 100 KeV and dose of about 4E13 is then applied to the top surface. The surface is then cleaned and a high temperature diffusion (at about 1050° C. for 480 minutes is then applied to drive the phosphorus implants to a depth of about 8000A to form N type channel diffusions 50, 51 and 52, which overlap the enhancement implants 30, 31, as shown.

Figure 3:
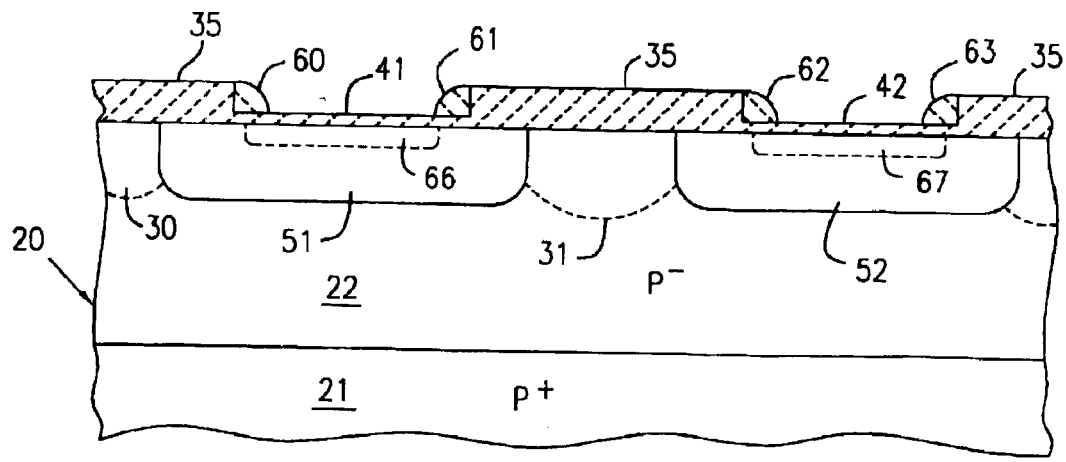
FIG. 3 is a cross-section of the wafer of FIG. 2 after the formation of polysilicon spacers and a shallow $N^+$ implant.

Following the channel drive, an undoped layer of polysilicon is grown atop the wafer, and is etched to leave polysilicon spacers 60, 62, 63 and 64 (FIG. 3) in place. After the spacer etch, the wafer is subjected to an HF etch (1001: HF) for about 20 seconds. A shallow N+ implant is then applied to the top surface of the wafer, forming shallow N+ implants 66 and 67 which are self aligned to the channel mask, but is pulled back by the poly spacers so they do not contribute to the doping at the channel/oxide interface. Implants 66 and 67 are contact regions for a subsequently formed source contact.

Figure 4:
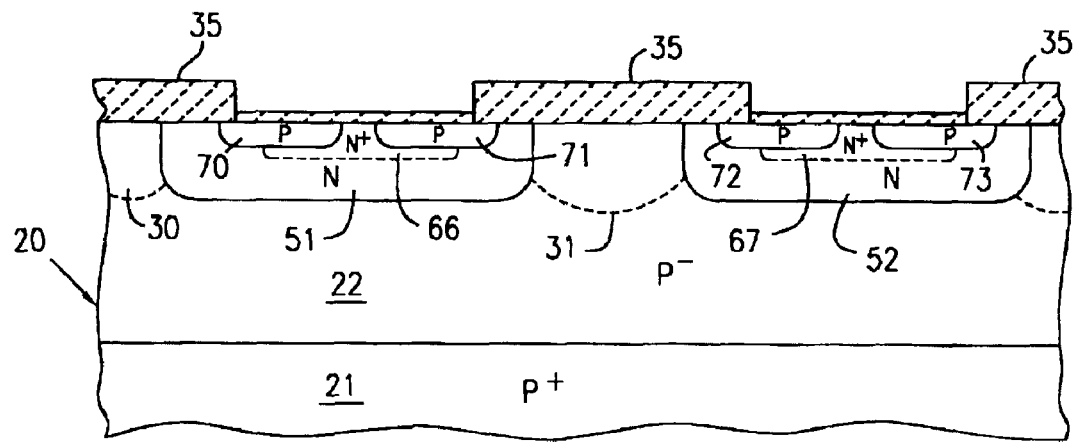
FIG. 4 is a cross-section of the wafer of FIG. 3 after the removal of the polysilicon spacers and the formation of P type source regions.

The spacers 60 to 63 are then appropriately removed as shown in FIG. 4 and the top (or front side) of the wafer is protected by a photoresist coat to enable a back side polysilicon etch to remove polysilicon from the P+ back side of the wafer (not shown). An N+ diffusion drive (at 1050° C. for 180 minutes) is then used to drive regions 66 and 67. All oxides are then removed as by etching.

Therefore, a photoresist is applied to the top surface and a source mask step is photolithographically carried out. Boron P+ source regions 70, 71, 72 and 73 (FIG. 4) are then implanted through the source windows at 80 KeV and a dose of about 2E15 the photoresist is stripped and, following a prediffusion clean, the sources 70 to 73 are suitably driven at high temperature (at 900° C. for 40 minutes).

A BOE oxide etch is then carried out to remove all oxides and a sacrificial gate oxide is grown. A TEOS field oxide is also grown on the wafer. An active mask step is then carried out, leaving field oxide only in the termination area and under the gate pads and gate runners (not shown). The photoresist is then stripped.

Figure 5:
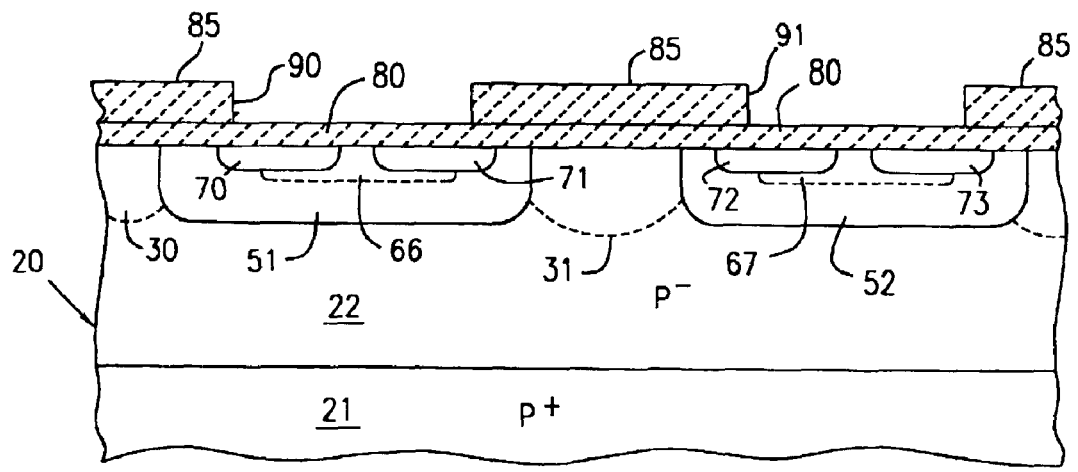
FIG. 5 is a cross-section of the wafer of FIG. 4 after the formation of a gate oxide and a conductive polysilicon gate electrode.

As shown in FIG. 5, and the gate oxide 80 (non-self aligned) is finally grown (after most high temperature diffusion steps have been completed). The gate oxide thickness is about 900 Å.

An undoped polysilicon layer 85 is next grown atop gate oxide 80 as shown in FIG. 5. The polysilicon layer is then made conductive by a boron implant at 50 KeV and a dose of 2E15. The boron is then driven with a poly drive, following a suitable diffusion drive (at 850° C. for 60 minutes).

Thereafter, a photoresist mask is formed on the top surface and a polysilicon mask and etch is carried out, forming windows 90 and 91 in FIG. 5 with the polysilicon gate electrodes overlying the invertible N channel regions such as region 70A formed between the source regions 70 to 73 and the JFET regions 30 and 31. Note that the gate structure is not self aligned with the source and channel regions as is the case when the gate is formed before the source and channel are formed, using the well known DMOS process. The resist is then stripped, forming the structure of FIG. 5. The polysilicon line width is preferably about 3.2 microns and the channel regions 51 and 52 are preferably spaced by about 0.6 microns.

Figure 6:
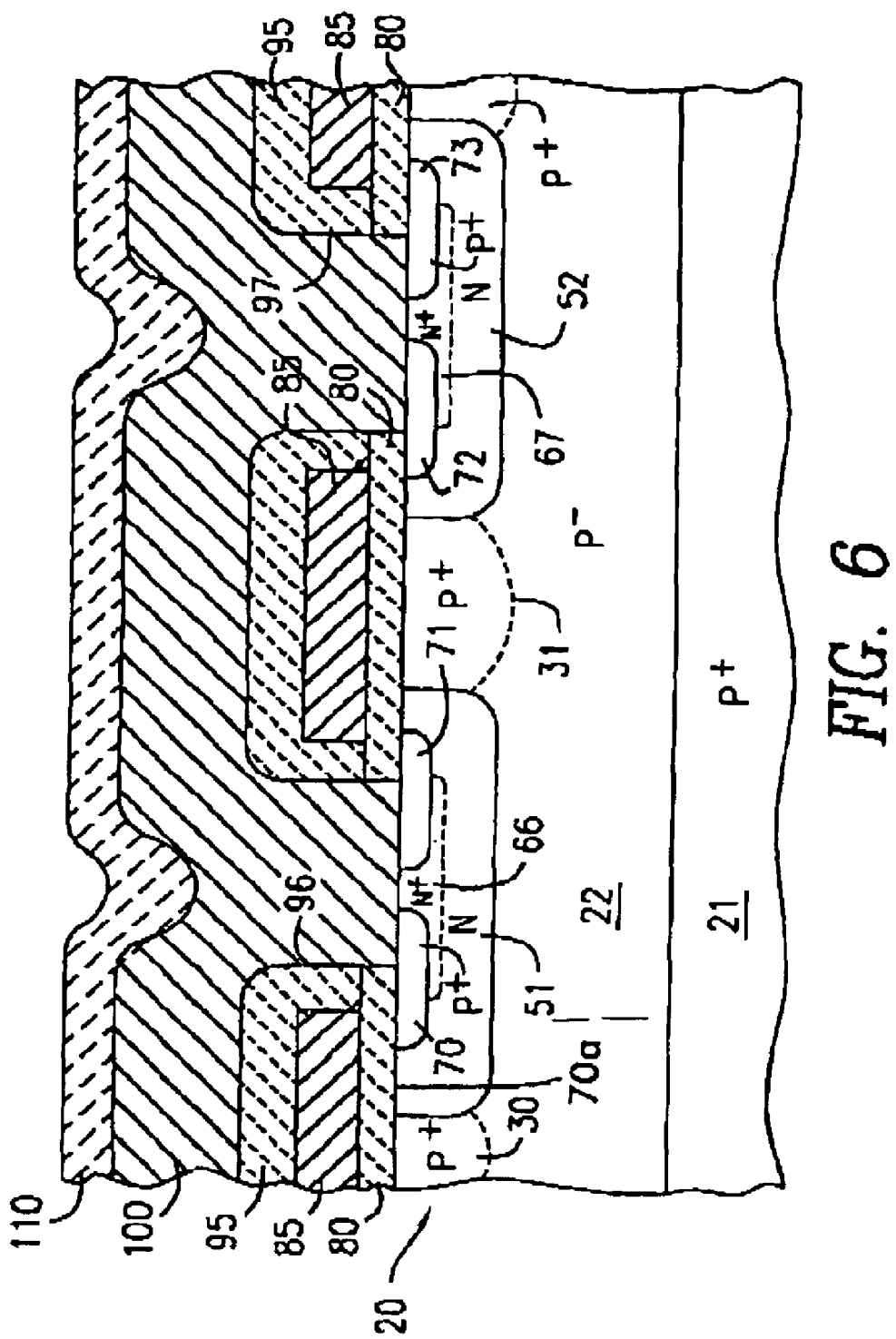
FIG. 6 shows the wafer of FIG. 5 after the formation of an insulation interlayer to insulate the polysilicon gate and the formation of the source electrode and atop insulation LTO layer.

Thereafter a TEOS oxide layer 95 is grown atop the wafer, encapsulating the polysilicon gate strips 85. A photoresist is applied to the top surface, and a contact mask step is photolithographically carried out. A plasma etch is then used to define contact windows 96 and 97 (FIG. 6), leaving the polysilicon gate strips encapsulated between TEOS layer 95 and the edges of gate oxide 80. The wafer is then cleaned to prepare the surfaces for a metal sputter operation. An aluminum source electrode 100 is then sputtered atop the wafer surface to a thickness of about 8 microns. Thereafter, a conventional metal mask step is carried out to define source and gate regions (not shown) and the photoresist is stripped and the metal surface is defreckled. An LTO oxide layer 110 is then deposited atop the aluminum layer 100 and a pad mask etch step is carried out to remove the LTO from the pad connection regions.

Finally, the resist is stripped, the front surface is taped, and the back surface (not shown) is ground and a suitable back drain metal is applied to the wafer back surface.

The resulting device has the desired properties of a Rad Hard P channel MOSFET with very low gate capacitance and very low on resistance.

Although the present invention has been described in relation to particular embodiments thereof, many other variations and modifications and other uses will become apparent to those skilled in the art. It is preferred, therefore, that the present invention be limited not by the specific disclosure herein

What is claimed is:

1. A Rad Hard MOSFET comprising a silicon wafer having a flat junction receiving region of one of the conductivity types; a plurality of closely spaced parallel elongated channel diffusions of the other conductivity type; a plurality of source diffusion regions of said one conductivity type in each of said channel diffusions defining a plurality of respective invertible channel regions between boundary portions of said channel diffusions and respective boundary portions of said source diffusions; a non-self aligned gate oxide and conductive gate polysilicon segments overlying each of respective ones of said invertible channel regions formed between each of said channel diffusions and respective source regions; and an enhancement diffusion of said one conductivity type disposed in the space between adjacent pairs of said channel regions and contacting each of said channel regions of each of said adjacent pairs; said enhancement diffusion having a higher concentration than that of said junction receiving region.

2. The Rad Hard MOSFET of claim 1, wherein the space between said adjacent channel diffusions is about 0.6 microns.

3. The Rad Hard MOSFET of claim 1, wherein said polysilicon gate segments have a poly line width of about 3.2 microns.

4. The Rad Hard MOSFET of claim 1, wherein said enhancement implant has a depth which is equal to about the depth of said channel regions.

5. The Rad Hard MOSFET of claim 4, wherein said enhancement implant has a depth of about 1.5μ.

6. The Rad Hard MOSFET of claim 1, wherein said one of the conductivity types is the P type and the other of the conductivity types is N and said MOSFET is a P channel device.

7. The Rad Hard MOSFET of claim 1, which further includes a conductive source electrode formed atop said junction receiving region and in contact with each of said source and channel diffusions.

8. The Rad Hard MOSFET of claim 7, wherein the bottom of said wafer has a drain electrode formed thereon, whereby said MOSFET is a vertical conduction MOSFET.

9. The Rad Hard MOSFET of claim 2, wherein said polysilicon gate strips have a poly line width of about 3.2 microns.

10. The Rad Hard MOSFET of claim 2, wherein said enhancement implant has a depth which is equal to about the depth of said channel regions.

11. The Rad Hard MOSFET of claim 10, wherein said enhancement implant has a depth of about 1.5μ.

12. The Rad Hard MOSFET of claim 2, wherein said one of the conductivity types is the P type and the other of the conductivity types is N and said MOSFET is a P channel device.

13. The Rad Hard MOSFET of claim 2, which further includes a conductive source electrode formed atop said junction receiving region and in contact with each of said source and channel diffusions.

14. The Rad Hard MOSFET of claim 13, wherein the bottom of said wafer has a drain electrode formed thereon, whereby said MOSFET is a vertical conduction MOSFET.

15. The Rad Hard MOSFET of claim 9, wherein said enhancement implant has a depth which is equal to about the depth of said channel regions.

16. The Rad Hard MOSFET of claim 15, wherein said enhancement implant has a depth of about 1.5μ.

17. The Rad Hard MOSFET of claim 9, wherein said one of the conductivity types is the P type and the other of the conductivity types is N and said MOSFET is a P channel device.

18. The Rad Hard MOSFET of claim 9, which further includes a conductive source electrode formed atop said junction receiving region and in contact with each of said source and channel diffusions.

19. The Rad Hard MOSFET of claim 18, wherein the bottom of said wafer has a drain electrode formed thereon, whereby said MOSFET is a vertical conduction MOSFET.

20. The Rad Hard MOSFET of claim 15, wherein said one of the conductivity types is the P type and the other of the conductivity types is N and said MOSFET is a P channel device.

21. The Rad Hard MOSFET of claim 10, wherein said polysilicon gate strips have a poly line width of about 3.2 microns.

22. The Rad Hard MOSFET of claim 20, wherein the space between said adjacent channel diffusions is about 0.6 microns.

* * * * *